United States Patent
Logue

(10) Patent No.: US 6,384,647 B1
(45) Date of Patent: May 7, 2002

(54) DIGITAL CLOCK MULTIPLIER AND DIVIDER WITH SYCHRONIZATION DURING CONCURRENCES

(75) Inventor: John D. Logue, Placerville, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/713,651

(22) Filed: Nov. 14, 2000

Related U.S. Application Data

(60) Provisional application No. 60/229,705, filed on Aug. 31, 2000.

(51) Int. Cl.[7] .................................................. H03L 7/00
(52) U.S. Cl. ........................ 327/153; 327/116; 327/298
(58) Field of Search ................................. 327/291, 296, 327/298, 299, 40, 41, 47, 145, 147, 149, 153, 161, 115, 116, 117, 119

(56) References Cited

U.S. PATENT DOCUMENTS

| | | | | |
|---|---|---|---|---|
| 3,942,121 A | * | 3/1976 | Bell et al. ................. | 455/160.1 |
| 5,254,955 A | * | 10/1993 | Saeki et al. ................. | 327/156 |
| 5,577,086 A | * | 11/1996 | Fujimoto et al. ........... | 331/1 A |
| 5,592,515 A | * | 1/1997 | Saban et al. ................. | 375/340 |
| 5,787,125 A | * | 7/1998 | Mittel ........................ | 375/316 |
| 5,825,253 A | | 10/1998 | Mathe et al. | |
| 5,910,740 A | | 6/1999 | Underwood | |
| 5,923,715 A | * | 7/1999 | Ono ........................... | 375/376 |
| 6,185,691 B1 | * | 2/2001 | Gandhi et al. .............. | 713/500 |
| 6,225,840 B1 | * | 5/2001 | Ishimi ........................ | 327/116 |

* cited by examiner

*Primary Examiner*—Toan Tran
*Assistant Examiner*—Cassandra Cox
(74) *Attorney, Agent, or Firm*—Edward S. Mao

(57) ABSTRACT

A digital variable clocking circuit is provided. The variable clocking circuit is configured to receive an input clock signal and to generate an output clock signal having an output clock frequency equal to the frequency of the input clock signal multiplied by a multiplier M and divided by a divisor D. In one embodiment of the present invention, the average frequency of the output clock signal during a concurrence period is equal to the selected frequency because the active edge of the output clock signal is triggered by the rising edge of the reference clock signal during a concurrence. Furthermore, the waveform of the output clock signal is shaped to approximate the waveform of an ideal output clock signal by selectively inserting delays distributed throughout the concurrence period using a Modulo-M delta sigma circuit. The modulo-M delta sigma circuit, which receives modulo value M, a pulse value P, and a clock signal, generates an output signal that includes P pulses spread across M clock periods.

23 Claims, 10 Drawing Sheets

US 6,384,647 B1

DIGITAL CLOCK MULTIPLIER AND DIVIDER WITH SYCHRONIZATION DURING CONCURRENCES

CROSS-REFERENCE TO RELATED APPLICATIONS

This application claims the benefit of commonly assigned, co-pending provisional U.S. patent application No. 60/229,705, entitled "DIGITAL CLOCK MULTIPLIER AND DIVIDER WITH SYCHRONIZATION DURING CONCURRENCES," invented by John D. Logue and filed Aug. 31, 2000, which is incorporated herein by reference.

FIELD OF THE INVENTION

The present invention relates to clocking circuits for digital systems. More specifically, the present invention relates to a digital clock multiplier and divider, which can easily be integrated into digital circuits.

BACKGROUND OF THE INVENTION

Clocking signals are used for a variety of purpose in digital circuits on both board level systems and integrated circuit (IC) devices, such as field programmable gate arrays (FPGAs) and microprocessors. For example, in synchronous systems, global clock signals are used to synchronize various circuits across the board or IC device. However, as the complexity of digital systems increases, clocking schemes for synchronous systems become more complicated. For example, many complex digital systems, such as microprocessors and FPGAs, have multiple clock signals at different frequencies. For example, in some microprocessors, internal circuits are clocked by a first clock signal at a first clock frequency while input/output (I/O) circuits are clocked by a second clock signal at a second clock frequency. Typically, the second clock frequency is slower than the first clock frequency.

Multiple clock generating circuits can be used to generate the multiple clock signals; however, clock generating circuits typically consume a large amount of chip or board space. Therefore, most systems use one clock generating circuit to generate a first clock signal and a specialized circuit to derive other clock signals from the first clock signal. For example, clock dividers are used to generate one or more clock signals of lower clock frequencies from a reference clock signal. Typically, clock dividers divide the frequency of the reference clock signal by an integer value. Conversely, clock multipliers are used to generate one or more clock signals of higher clock frequencies from the reference clock signal. Combining clock multipliers with clock dividers provide clocking circuits which can generate one or more clock signals having frequencies that are fractional values of the frequency of the reference clock signal.

FIG. 1 shows a conventional clocking circuit 100. Clocking circuit 100 receives a reference clock signal REF_CLK having a frequency F_REF and generates an output clock signal O_CLK having a frequency F_OUT, where F_OUT is equal to frequency F_REF multiplied by a multiplier M and divided by a divider D, i.e., F_OUT=F_REF*M/D. Clocking circuit 100 comprises a clock divider 105, a frequency comparator 110, a charge pump 120, a voltage controlled oscillator (VCO) 140, and a clock divider 150. Clock divider 105 divides reference clock signal REF_CLK to generate a divided reference clock signal D_REF_CLK having a frequency F_D_REF equal to frequency F_REF divided by D. Similarly, clock divider 150 divides output clock signal O_CLK to generate a feedback clock signal FBK_CLK having a frequency F_FBK equal to frequency F_OUT divided by M. Reference clock signal REF_CLK may be referred to as the primary reference clock signal.

Frequency comparator 110 compares frequency F_FBK of feedback clock signal FBK_CLK with frequency F_D_REF of divided reference clock signal D_REF_CLK. If frequency F_FBK of feedback clock signal FBK_CLK is greater than frequency F_D_REF of divided reference clock signal D_REF_CLK, frequency comparator 110 causes charge pump 120 to decrease the voltage level of VCO control signal VCO_C, which is coupled to voltage controlled oscillator 140, to reduce frequency F_OUT of output clock signal O_CLK, which is generated by voltage controlled oscillator 140. Conversely, if frequency F_FBK of feedback clock signal FBK_CLK is less than frequency F_D_REF of divided reference clock signal D_REF_CLK, frequency comparator 110 causes charge pump 120 to increase the voltage level of VCO control signal VCO_C to increase frequency F_OUT of output clock signal O_CLK. Thus, eventually, frequency F_FBK of feedback clock signal FBK_CLK equals frequency F_D_REF of divided reference clock signal D_REF_CLK. As explained above, frequency F_D_REF of divided reference clock signal D_REF_CLK is equal to frequency F_REF of reference clock signal REF_CLK divided by D, i.e., F_D_REF=F_REF/D. Similarly, as explained above, frequency F_FBK of feedback clock signal FBK_CLK is equal to frequency F_OUT of output clock signal O_CLK divided by M, i.e., F_FBK=F_OUT/M. Thus, frequency F_OUT of output clock signal O_CLK is equal to frequency F_REF of reference clock signal REF_CLK multiplied by M and divided by D, i.e., F_OUT=F_REF*M/D.

While clocking circuit 100 provides the desired functionality of a clock multiplier/divider, clocking circuit 100 is hampered by the use of analog components, which require a large amount of semiconductor area. Specifically, charge pump 120 and voltage controlled oscillator 140 are analog circuits, which increase the cost of clocking circuit 100 due to increased semiconductor real estate. Furthermore, analog circuits are more susceptible to electromagnetic interference (i.e., noise) as compared to digital circuits. Hence, there is a need for a variable clock multiplier/divider using only digital circuits, which generates an output clock signal having a clock frequency equal to the clock frequency of a reference clock signal multiplied by a multiplier M and divided by a divider D.

SUMMARY

Accordingly, variable clocking circuits in accordance with the present invention are created using variable digital oscillators and digital control circuits to generate an output clock signal having a clock frequency equal to the clock frequency of a reference clock signal multiplied by a multiplier M and divided by a divider D. When the frequency of the output clock signal is equal to the selected frequency and the output clock signal is in phase with the reference clock signal, every Mth rising edge of the output clock signal O_CLK aligns with a rising edge of the reference clock signal. The alignments are commonly referred to as concurrences. The time between two consecutive concurrences is commonly referred to as a concurrence period. The present invention avoids cumulative rounding errors caused by the imprecision of digital delay lines by synchronizing the output clock signal with the reference clock signal at each concurrence. Furthermore, a circuit according to one embodiment of present invention shapes the waveform of an output clock signal by selectively inserting delays during a concurrence period.

In one embodiment of the present invention, a variable clocking circuit includes a variable oscillator, a first clock divider, and a frequency comparator. The variable oscillator generates the output clock signal. The first clock divider divides the output clock signal by M and generates a feedback clock signal. The frequency comparator, which receives both the reference clock signal and the feedback clock signal, adjusts the frequency of the output clock signal so that the frequency of the feedback clock signal is approximately equal to the frequency of the reference clock signal. To eliminate cumulative rounding errors from using digital circuits, the active edges of the output clock signal occurring during a concurrence are synchronized with the active edge of the reference clock signal. Generally, the variable oscillator includes a variable delay line and an edge-triggered latch. The edge triggered latch is clocked by the output of the delay line except during a concurrence. During a concurrence the edge-triggered latch is clocked by the reference clock signal.

Some embodiments of the present invention include a delay line fine tuning controller to shape the waveform of the output clock signal to more accurately match the waveform of an ideal output clock signal. The delay line fine tuning controller determines the number of additional base delay units necessary during a concurrence period. The additional base delay units are then distributed evenly across the concurrence period. The distribution is accomplished by using a novel modulo-M delta sigma circuit. In one embodiment, the modulo-M delta sigma circuit includes a multiplier, a subtracter, an adder, a multiplexing circuit, a latch, and a comparator.

The present invention will be more fully understood in view of the following description and drawings.

DETAILED DESCRIPTION

Figure 1:
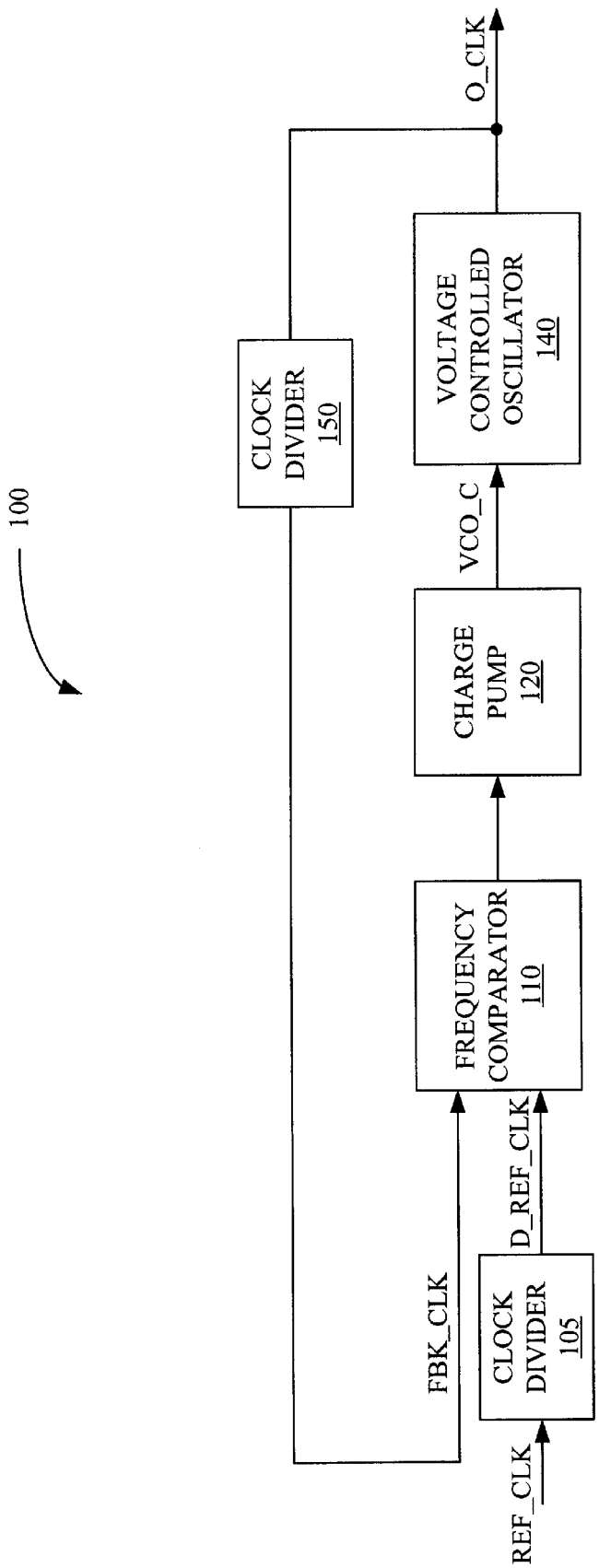
FIG. 1 is a block diagram of a conventional clocking circuit.
Figure 2A:
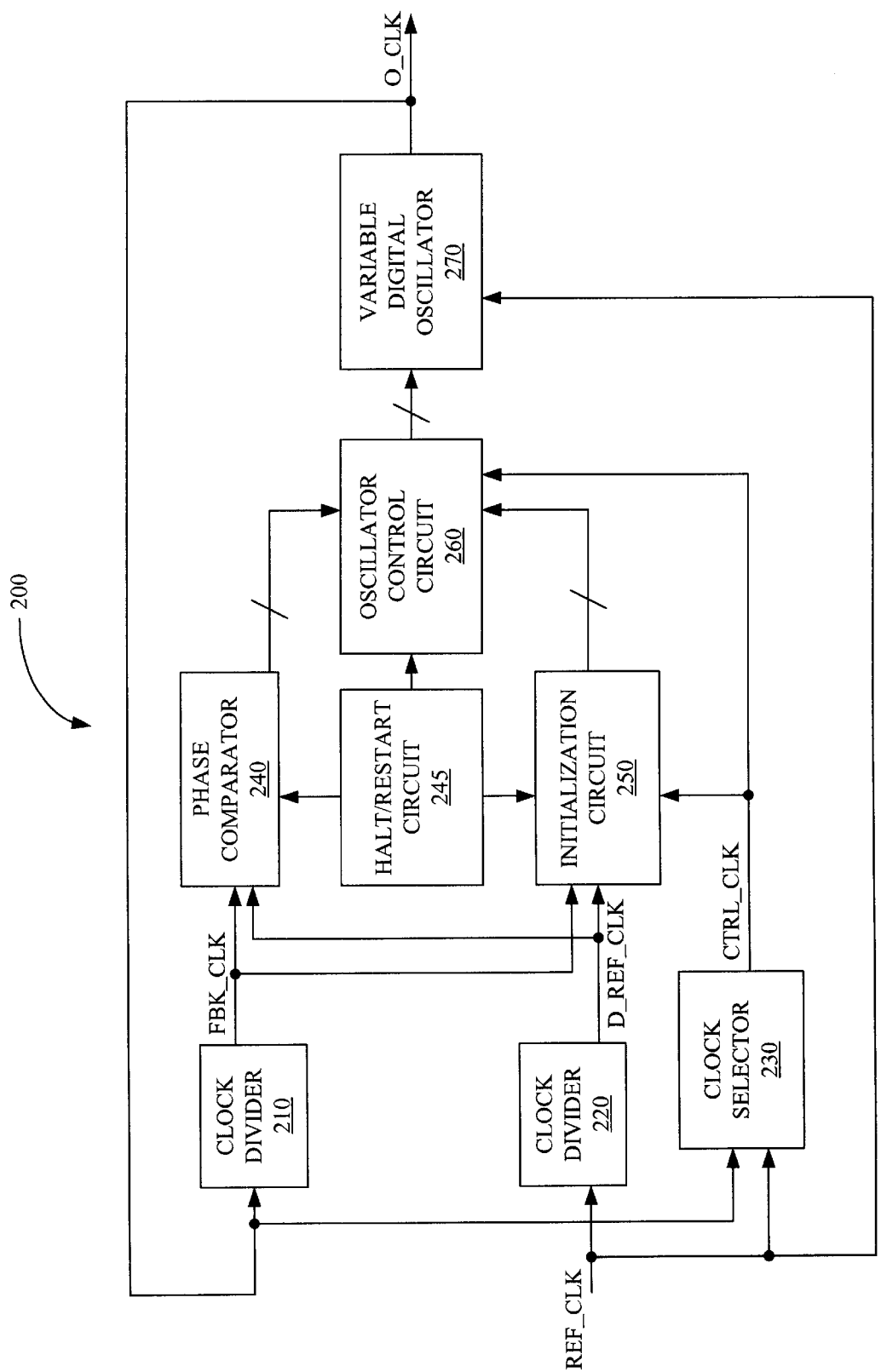
FIG. 2(a) is a block diagram of a variable clocking circuit in accordance with one embodiment of the present invention.

FIG. 2(a) is a block diagram of a variable clocking circuit 200 in accordance with one embodiment of the present invention. Variable clocking circuit 200 generates an output clock signal O_CLK having a clock frequency F_OUT equal to a clock frequency F_REF of a reference clock signal REF_CLK multiplied by a multiplier M and divided by a divider D (i.e., F_OUT=M*F_REF/D). Variable clocking circuit 200 comprises clock dividers 210 and 220, optional clock selector 230, phase comparator 240, halt/restart circuit 245, initialization circuit 250, oscillator control circuit 260, and variable digital oscillator 270. Clock divider 210 receives output clock signal O_CLK, which is generated by variable digital oscillator 270, and generates feedback clock signal FBK_CLK having a frequency F_FBK equal to frequency F_OUT of output clock O_CLK divided by multiplier M. Clock divider 210 drives feedback clock signal FBK_CLK to initialization circuit 250 and phase comparator 240. Clock divider 220 receives reference clock signal REF_CLK and generates divided reference clock signal D_REF_CLK having a frequency F_D_REF equal to frequency F_REF of reference clock signal REF_CLK divided by divider D. Clock divider 220 drives divided reference clock signal D_REF_CLK to initialization circuit 250 and phase comparator 240.

Clock selector 230 receives both reference clock signal REF_CLK and output clock signal O_CLK and selectively drives either reference clock signal REF_CLK or output clock signal O_CLK as control clock signal CTRL_CLK to initialization circuit 250 and oscillator control circuit 260. Generally, reference clock signal REF_CLK is used during a coarse frequency search phase. Then, output clock signal O_CLK is used for a fine frequency search phase as well as during a clock maintenance phase, i.e., maintaining the frequency of output clock signal O_CLK at the selected frequency. The coarse frequency search phase, the fine frequency search phase, and the maintenance phase for one embodiment of the present invention is described in detail below. Halt/restart circuit 245, which is used during coarse frequency search phase and the fine frequency search phase, is described below.

At power-on or reset, initialization circuit 250 controls oscillator control circuit 260 to tune variable digital oscillator 270 to generate output clock signal O_CLK. Specifically, initialization circuit 250 tunes variable digital oscillator 270 so that frequency F_OUT of output clock signal O_CLK is equal to a selected frequency F_SEL, which equals frequency F_REF of reference clock signal REF_CLK multiplied by multiplier M and divided by divider D. After frequency F_OUT of output clock signal O_CLK reaches selected clock frequency F_SEL, initialization circuit 250 passes control of oscillator control circuit 260 and variable digital oscillator 270 to phase comparator 240. Phase comparator 240 tunes variable digital oscillator 270 to maintain frequency F_OUT at selected frequency F_SEL despite environmental changes such as temperature.

Some embodiments of variable clocking circuit 200 can use conventional clock dividers, clock selectors, halt/restart circuits, and phase comparators. However, detailed descriptions of specific embodiments of initialization circuits 250, oscillator control circuit 260, and variable digital oscillator 270 are described below.

Figure 2B:
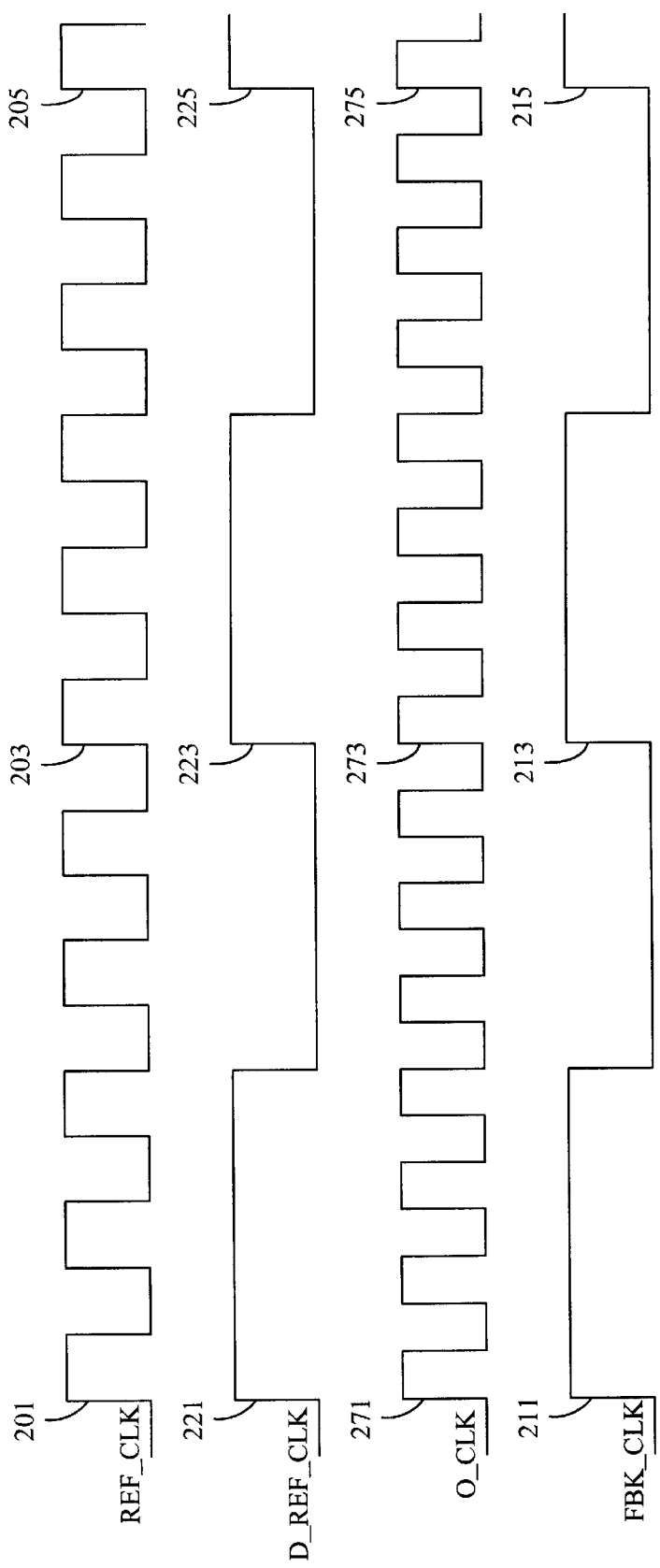
FIG. 2(b) is a timing diagram for the variable clocking circuit of FIG. 2(a).

FIG. 2(b) is a timing diagram for variable clocking circuit 200. For clarity, FIG. 2(b) and other timing diagrams contained herein are idealized and omit such factors as propagation delay and skewing. In FIG. 2(b), multiplier M is equal to 7 and divider D is equal to 5. Thus, as shown in FIG. 2(b), divided reference clock signal D_REF_CLK has a rising edge, such as rising edges 221, 223, and 225, at every fifth rising edge of reference clock signal REF_CLK, i.e., at rising edges 201, 203, and 205. Similarly, feedback clock signal FBK_CLK has a rising edge, such as rising edges 211, 213, and 215, every seventh rising edge of output clock signal O_CLK, i.e., at rising edges 271, 273 and 275. When frequency F_OUT of output clock signal O_CLK is equal to selected frequency F_SEL and reference clock signal REF_CLK is in phase with output clock signal O_CLK, feedback clock signal FBK_CLK and divided reference clock signal D_REF_CLK have the same phase and frequency. Accordingly, initialization circuit 250 and phase comparator 240 tune variable digital oscillator 270 to match the phase and frequency of divided reference clock signal D_REF_CLK and feedback clock signal FBK_CLK to drive output clock signal O_CLK at selected frequency F_SEL. When the phase and frequency of divided reference clock signal D_REF_CLK and feedback clock signal FBCK_CLK match, every mth rising edge of output clock signal O_CLK aligns with a rising edge of reference clock signal REF_CLK. For example, rising edges 271 and 273 of output clock signal O_CLK align with rising edges 201 and 203 of reference clock signal REF_CLK. The alignments are commonly referred to as concurrences. The time between two consecutive concurrences is commonly referred to as a concurrence period.

Figure 3A:
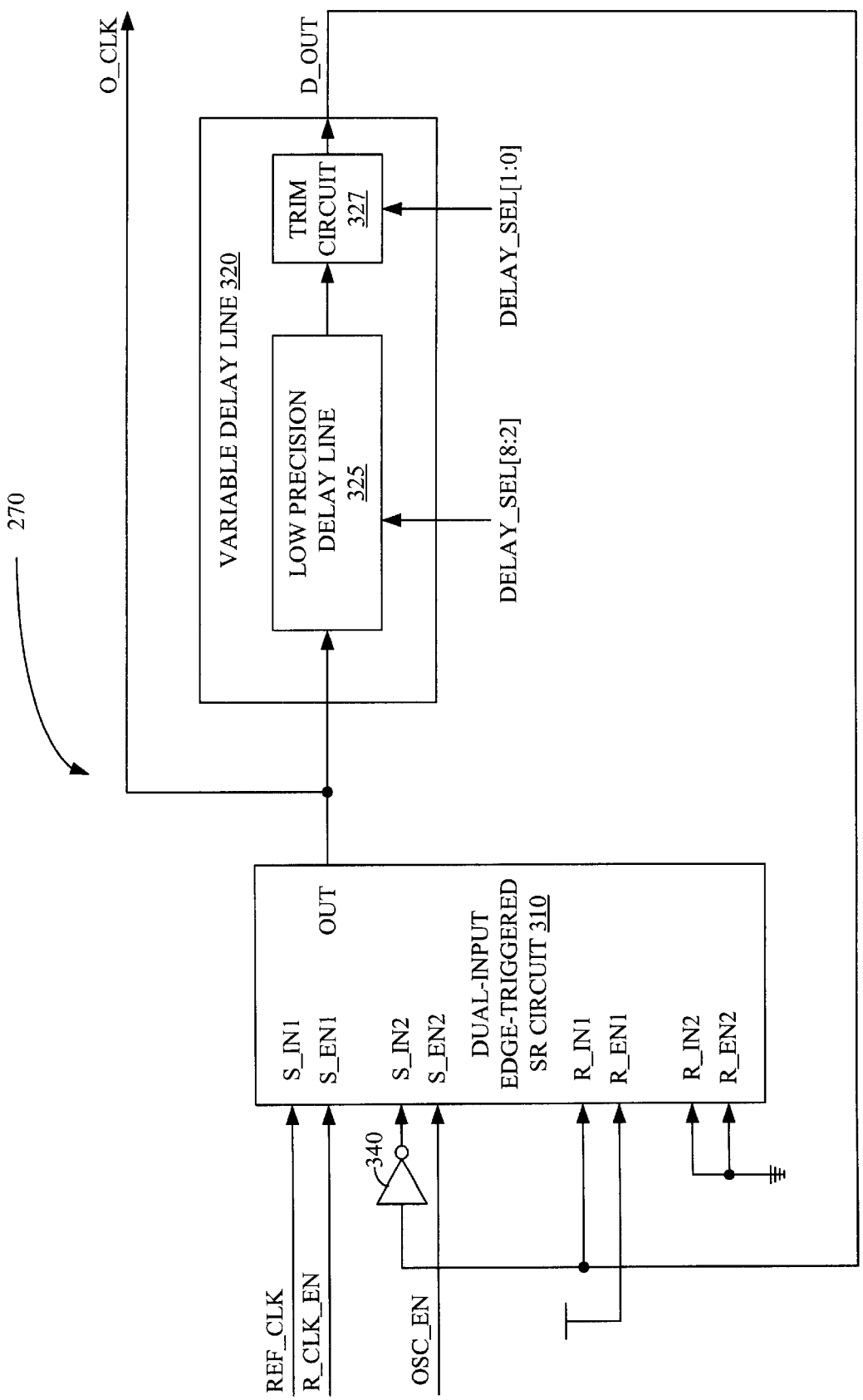
FIG. 3(a) is schematic diagram of a variable digital oscillator in accordance with one embodiment of the present invention.

FIG. 3(*a*) is a block diagram of an embodiment of variable digital oscillator 270. The embodiment of FIG. 3 comprises a dual-input edge-triggered SR circuit 310, an inverter 340, and a variable delay line 320 having a low precision delay line 325 and a trim circuit 327. Dual-input edge-triggered SR circuit 310 includes a first set input terminal S_IN1, a first set enable input terminal S_EN1, a second set input terminal S_IN2, a second set enable input S_EN2, a first reset input terminal R_IN1, a first reset enable input terminal R_EN1, a second reset input terminal R_IN2, a second reset enable input terminal R_EN2, and an output terminal OUT. Operation and construction of dual-input edge-triggered SR circuits are well known in the art and therefore are not described in detail herein. Table 1 provides a truth table for an active high version of dual-input edge-triggered SR CIRCUIT 310. Basically, an active (e.g., rising) edge of a set input signal on a set terminal while the corresponding set enable signal at the set enable terminal is at an enabled logic level (e.g., logic high) causes output terminal OUT to drive an output signal to an active state (e.g., logic high). Conversely, an active (e.g., rising) edge on a reset input signal on a reset terminal while the corresponding reset enable signal on the corresponding reset enable terminal is at an enabled logic level (e.g., logic high) causes output terminal OUT to drive an output signal to an inactive state (e.g., logic low). For clarity, the circuits herein are described using logic high as the enabled logic level and the active logic level. Similarly, rising edges are used as the active edges. However, those skilled in the art can apply the principles of the present invention using different enabled logic levels, active logic levels, and active edges.

TABLE 1

| S_IN1 | S_EN1 | S_IN2 | S_EN2 | R_IN1 | R_EN1 | OUT |
|---|---|---|---|---|---|---|
| RE | H | X | X | X | X | H |
| X | X | RE | H | X | X | H |
| X | X | X | X | RE | H | L | where RE is a rising edge, H is logic high, L is logic low, and X is a do not care condition.

Reference clock signal REF_CLK is coupled to first set input terminal S_IN1 and a reference clock enable signal R_CLK_EN is coupled to first enable input terminal S_EN1. Output terminal OUT of dual edge-triggered SR CIRCUIT 310 drives output clock signal O_CLK and is coupled to variable delay line 320. In the embodiment of FIG. 3(*a*), variable delay line 320 is implemented using a low precision delay line 325 having a base delay BD and a trim circuit 327 that provides a delay of 0, 0.25, 0.50, or 0.75 times base delay BD. Other embodiments of the present invention can use conventional variable delay lines. Variable delay line 320 delays the output signal of dual-input edge-triggered SR circuit 310 by a variable amount under the control of oscillator control circuit 260 to generate delayed output signal D_OUT. Delayed output signal D_OUT is coupled to first reset input signal R_IN1 as well as the input terminal of inverter 340. The output terminal of inverter 340 is coupled to second set input terminal S_IN2. An oscillator enable signal OSC_EN is coupled to second set enable terminal S_EN2. Under normal operations, oscillator enable signal OSC_EN is in the logic high state to enable variable digital oscillator 270. Therefore, a rising edge from output terminal OUT that is delayed by variable delay line 320 causes dual-input edge-triggered SR circuit 310 to transition to logic low. Conversely, a falling edge from output terminal OUT that is delayed by variable delay line 320 and inverted by inverter 340 causes dual-input edge-triggered SR circuit 310 to transition to logic high. Thus, variable digital oscillator 270 generates a clock signal such as output clock signal O_CLK. The frequency of output clock signal O_CLK is controlled by the amount of delay provided by variable delay line 320.

In the embodiment of FIG. 3(*a*), low precision variable delay line 325 provides a variable delay ranging from 0 to 127 times low precision base delay LBD, where low precision base delay LBD is the smallest non-zero delay provided by low precision variable delay 325. Furthermore, trim circuit 330 provides an additional delay of 0, 0.25, 0.5 or 0.75 base delay units. Thus, in the embodiment of FIG. 3(*a*), variable delay line 320 can provide 512 delay values ranging from 0 to 127.75 low precision base delay LBD in multiples of 0.25 low precision base delay LBD. Thus, in the embodiment of FIG. 3(*a*), variable delay line 320 provides a delay between 0 and 511 times a base delay BD, which is equal to 0.25 times low precision base delay LED.

Depending on the frequency F_REF of reference clock signal REF_CLK, multiplier M, and divisor D, variable delay line 320 may not be able to provide the exact amount of delay necessary to generate output clock signal O_CLK at selected frequency F_SEL. FIG. 3(*b*) illustrates this problem of using digital delay lines in clock generation circuits. Specifically, FIG. 3(*b*) shows a reference clock signal REF_CLK, a conventional output clock signal C_O_CLK, and an output clock signal O_CLK generated using a dual-input edge-triggered SR circuit 310 in accordance with one embodiment of the present invention. In FIG. 3(*b*), rising edges 351, 361, and 371 of reference clock signal REF_CLK, conventional output clock signal C_O_CLK, and output clock signal O_CLK, respectively, are synchronized.

Figure 3B:
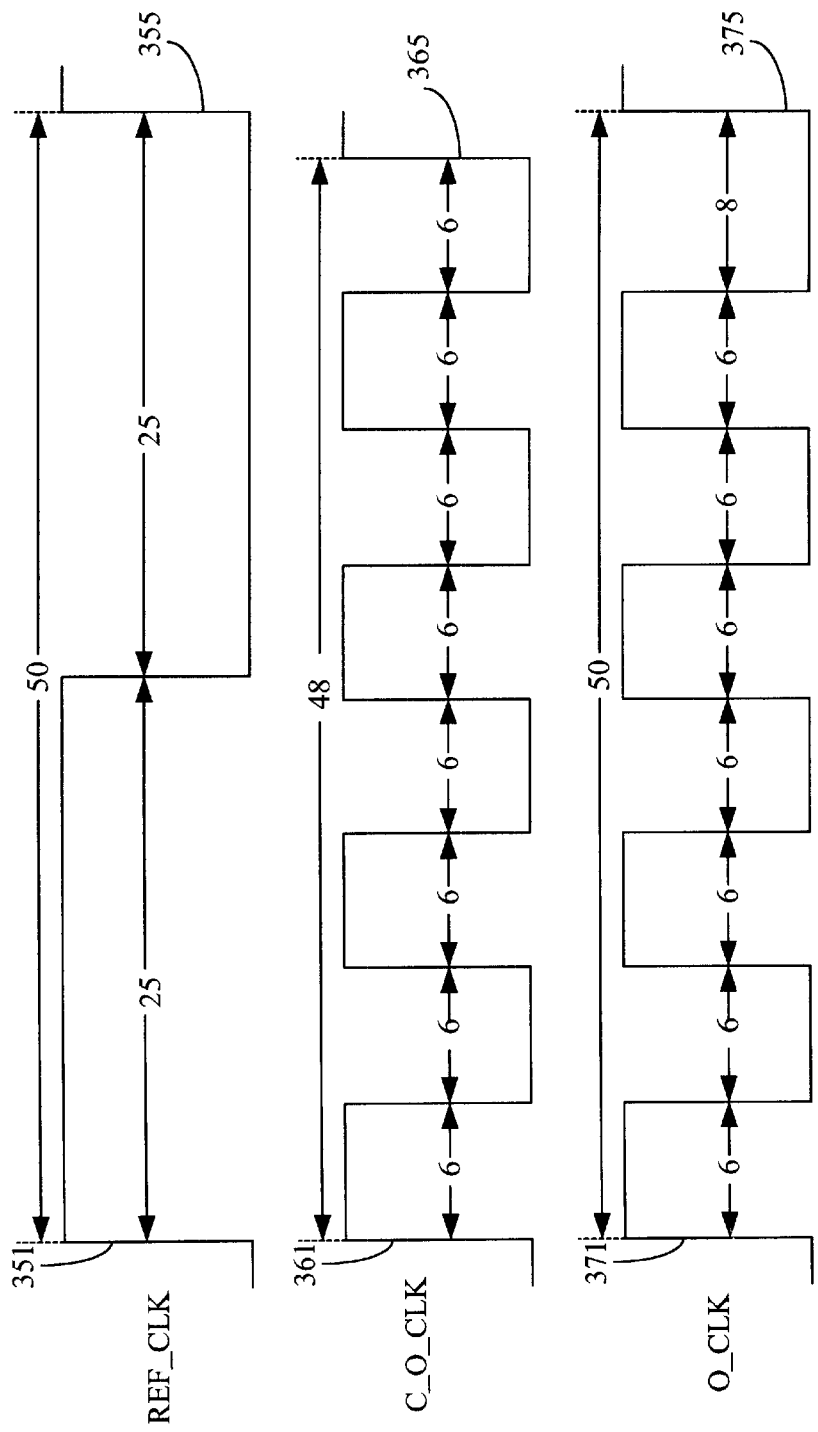
FIG. 3(b) is a timing diagram for the variable clocking circuit of FIG. 2(a) using the digital oscillator of FIG. 3(a).

In FIG. 3(*b*), multiplier M is equal to 4 and divider D is equal to 1. Reference clock signal REF_CLK has a period of 50 nanoseconds. Accordingly, 25 nanoseconds separates each consecutive clock edge in reference clock signal REF_CLK. Ideally, variable delay line 320 would provide a delay of 6.25 nanoseconds, which is equal to 25 divided by 4. However, if the base delay unit of variable delay line 320 (FIG. 3) is one nanosecond, then variable delay line 320 is configured to provide 6 nanoseconds of delay between consecutive edges of output clock signal O_CLK1. As explained above, during concurrence, i.e., every 4 periods, the rising edge of conventional output clock signal C_O_CLK should occur at the same time as the rising edge of reference clock signal REF_CLK. However, as illustrated in FIG. 3(b), rising edge 365 of conventional output clock C_O_CLK precedes rising edge 355 of reference clock signal REF_CLK by 2 nanoseconds. The two nanosecond misalignment reoccurs every concurrence period. Thus, over time the misalignment can cause serious synchronization problems in digital systems.

To eliminate the misalignment, just prior to concurrence, i.e., when a rising edge of reference clock signal REF_CLK should be aligned with a rising edge of output clock signal O_CLK, oscillator enable signal OSC_EN is deasserted and reference clock enable signal is asserted. Thus, during a concurrence the rising edge of reference clock signal REF_CLK on input terminal S_IN1 of dual-input edge-triggered SR circuit 310 causes a rising edge on output terminal OUT of dual-input edge-triggered SR circuit 310, which drives output clock signal O_CLK. After concurrence, oscillator enable signal OSC_EN is reasserted and reference clock enable signal R_CLK_EN is deasserted. Thus, every Mth clock period of output clock signal O_CLK, output clock signal O_CLK is realigned with reference clock signal REF_CLK even if variable delay line 320 does not provide the exact delay necessary to drive output clock signal O_CLK at selected frequency F_SEL.

Accordingly, as shown in FIG. 3(b), rising edge 375 of output clock signal O_CLK is aligned with rising edge 355 of reference clock signal REF_CLK. Therefore, the time between falling edge 374 of output clock signal O_CLK and rising edge 375 of output clock signal O_CLK is 8 nanoseconds rather than 6 nanoseconds. Thus, the time period during a concurrence cycle of output clock signal O_CLK is equal to 50 nanoseconds rather than 48 nanoseconds as would be dictated by using only variable delay line 320 to control the clock edges of output clock signal O_CLK. Consequently, the average frequency of output clock signal O_CLK over an concurrence period is equal to selected frequency F_SEL.

Figure 4:
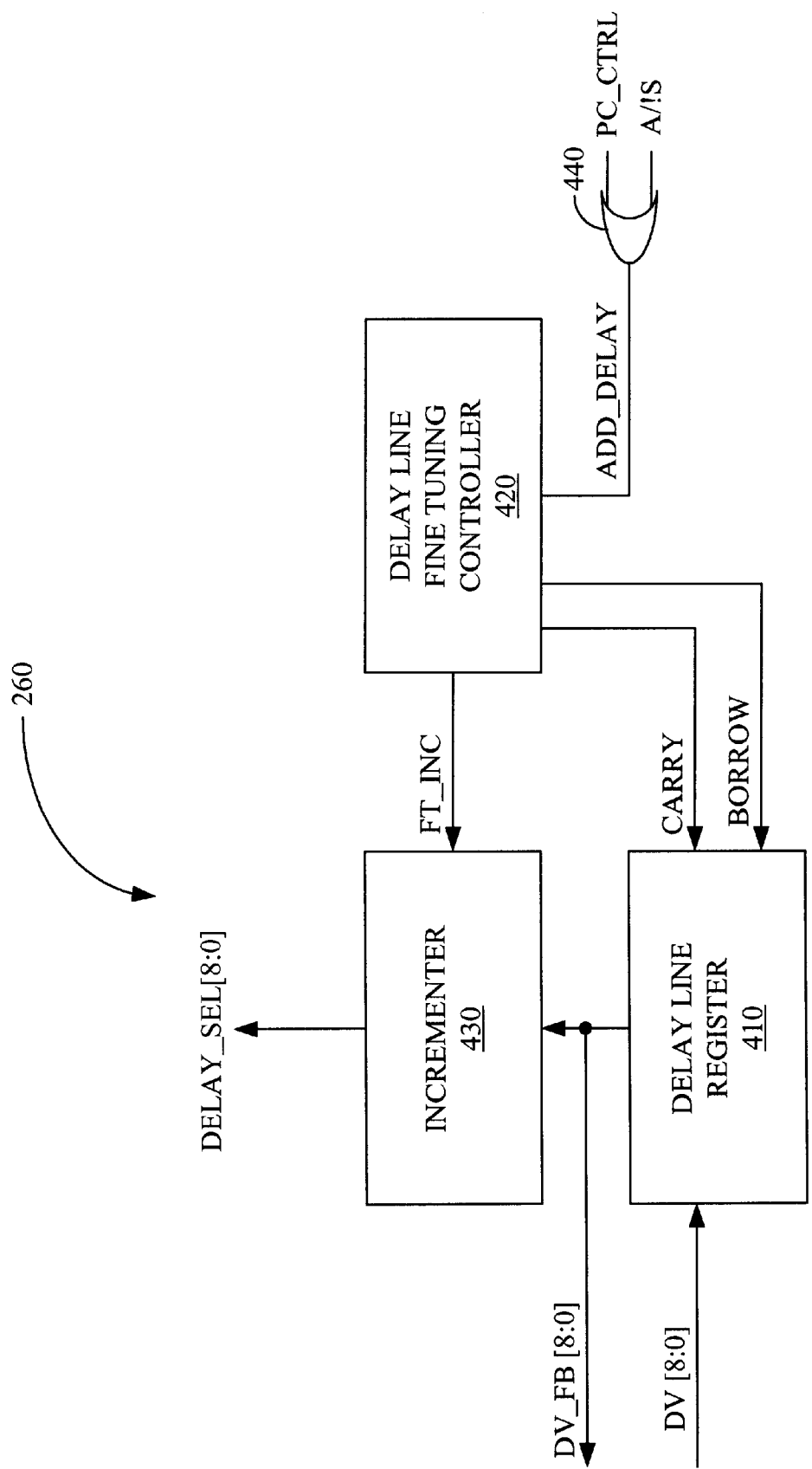
FIG. 4 is a block diagram of an oscillator control circuit in accordance with one embodiment of the present invention.

FIG. 4 is a block diagram of oscillator control circuit 260 in accordance with one embodiment of the present invention. The embodiment of FIG. 4 includes a delay line register 410, an optional incrementer 430, an optional delay line fine tuning controller 420, and an optional OR gate 440. Delay line register 410 receives a delay value DV[8:0] from initialization circuit 250 (FIG. 2). The contents of delay line register 410 are provided to incrementer 430 and initialization circuit 250 as delay value feedback signals DV_FB[8:0]. Initialization circuit 250 adjusts delay value DV[8:0] during the coarse frequency search phase to match frequency F_OUT of output clock signal O_CLK with selected frequency F_SEL as described below. Delay line register 410 also receives a carry signal CARRY and a borrow signal BORROW from delay line fine tuning controller 420. IF delay line fine tuning controller 420 is enabled, delay line register 410 is configured to increment when carry signal CARRY is in the active logic level (e.g., logic high) and to decrement on when borrow signal BORROW is in the active logic level (e.g., logic high). Generation of carry signal CARRY and borrow signal BORROW is described below.

The delay value in delay line register 410 is selectively incremented by incrementer 430 to generate delay select signals DELAY_SEL[8:0], which are coupled to variable delay line 320 (FIG. 3). Specifically, delay line fine tuning controller 420 drives a fine tuning increment control signal FT_INC to incrementer 430. If fine tuning increment control signal FT_INC is at an active logic level (e.g., logic high), then incrementer 430 increments the value from delay line register 410. Delay line fine tuning controller 420 is controlled by frequency comparator 250 using control signal A/!S or by phase comparator 240 (FIG. 2) using phase comparator control signal PC_CTRL. For the embodiment of FIG. 4, if delay line fine tuning controller 420 is enabled then if either control signal A/!S or phase comparator signal PC_CTRL is in the active state (i.e., logic high) then delay line fine tuning controller 420 is configured to add additional delay during a concurrence period. Thus, OR gate 440 generates add delay signal ADD_DELAY from control signal A/!S and phase comparator control signal PC_CTRL. The use of delay line fine tuning controller 420 is described in detail below.

Figure 5:
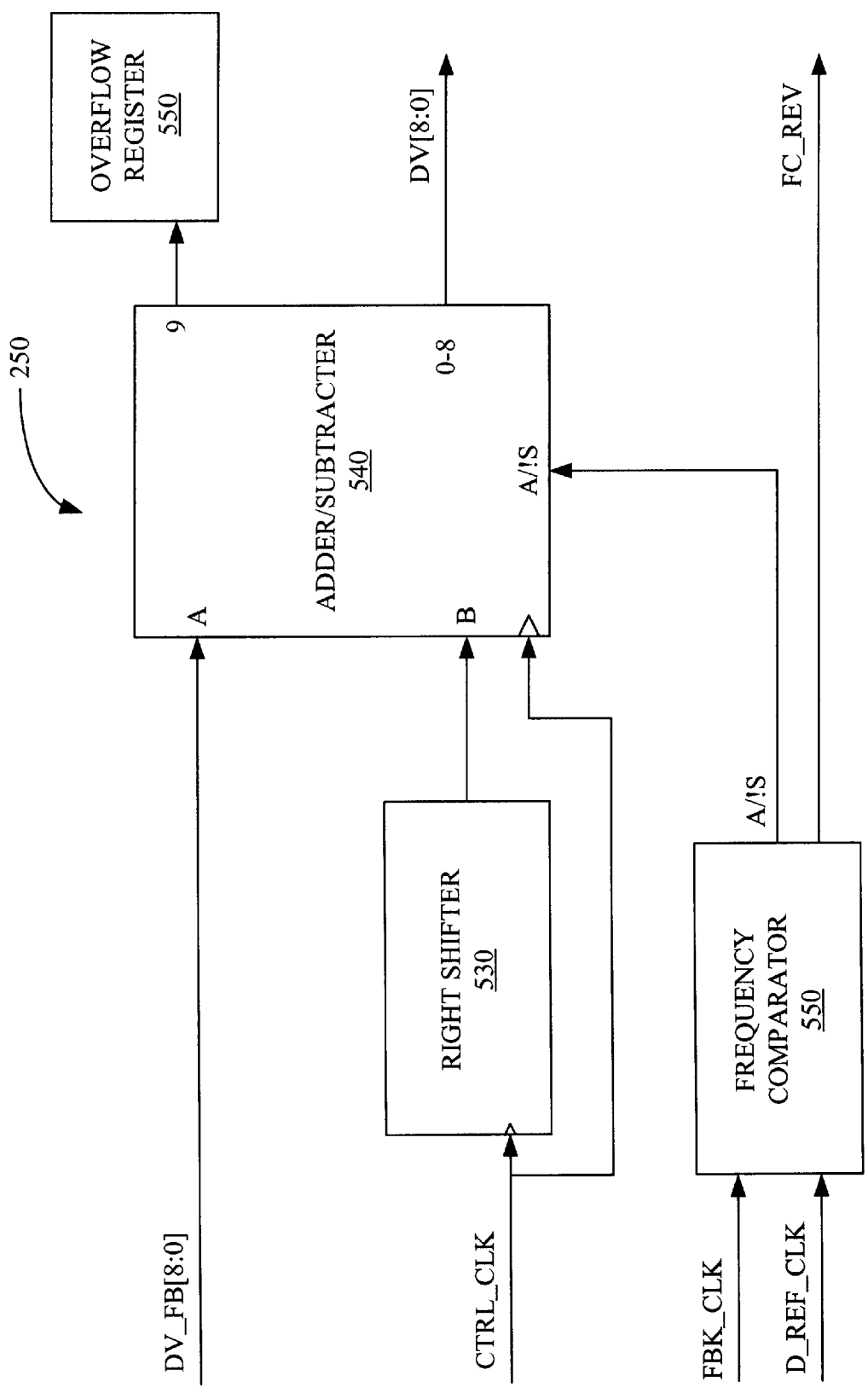
FIG. 5 is a block diagram of an initialization circuit in accordance with a second embodiment of the present invention.

FIG. 5 is a block diagram of initialization circuit 250 in accordance with one embodiment of the present invention. Initialization circuit 250 performs a coarse frequency search to set the value in variable delay line 320. Specifically, during the coarse frequency search phase, the embodiment of FIG. 5 performs a fast binary search to determine delay value DV[8:0] for delay line register 410, which causes frequency F_FBK of feedback clock FBK_CLK and frequency F_D_REF of divided reference clock D_REF_CLK to be equal. Other embodiments of initialization circuit 250 may use other methods to select delay value DV[8:0] for delay line register 410. The embodiment of FIG. 5 comprises a right shift register 530, an adder/subtractor 540, a frequency comparator 550, and an overflow register 550.

Initially, adder/subtractor 540 is configured to provide a delay value DV[8:0] that causes variable delay line 320 to provide 50% of the maximum delay that can be provided by variable delay line 320. For the embodiment of FIG. 3(a), delay value DV[8:0] is initially set at 256, i.e., halfway between 0 and 511. Right shift register 530 is initially configured to be equal to half of the initial value of delay value DV[8:0]. Thus, for the embodiment of FIG. 3(a), right shifter 530 is configured with an initial value of 128. Adder/subtractor 540 is controlled by frequency comparator 550 to either add the value in right shifter 530 to the value in delay line register 410 (FIG. 4) or to subtract the value in right shifter 530 to the value in delay line register 410. Specifically, the value in delay line register 410 is provided by delay value feedback signals DV_FB[8:0]. After each addition or subtraction operation, the content of right shifter 530 is "right shifted", which effectively divides the value in right shifter 530 in half. However, right shifter 530 maintains a minimum value of 1.

Frequency comparator 550 receives feedback clock signal FBK_CLK and divided reference signal D_REF_CLK and generates a control signal A/!S which dictates whether adder/subtractor 540 performs an ADD operation or a SUBTRACT operation. Specifically, if frequency F_FBK of feedback clock signal FBK_CLK is greater than frequency F_D_REF of divided reference clock signal D_REF_CLK, the delay provided by variable delay line should be increased. Accordingly, frequency comparator 550 causes adder subtractor 540 to perform an ADD operation by driving control signal A/!S to the add logic level (typically logic high). Conversely, if frequency F_FBK of feedback clock signal FBK_CLK is less than frequency F_D_REF of divided reference clock signal D_REF_CLK, the delay provided by variable delay line should be decreased. Accordingly, frequency comparator 550 causes adder/subtractor 540 to perform a SUBTRACT operation by driving control signal A/!S to the subtract logic level (typically logic low). After each addition or subtraction, halt/restart circuit 245 (FIG. 2) halts and restarts initialization circuit 250, and oscillator control circuit 260 so that output clock signal O_CLK is started in phase with reference clock signal REF_CLK. Halting and restarting allows frequency comparator 550 to determine the proper value of control signal A/!S without having to compensate for phase variations. However, some embodiments of the present invention may use frequency comparators that automatically compensate for phase variations. For these embodiments, halting and restarting may not be necessary.

In some embodiments of the present invention, frequency comparator 550 also generates a frequency comparator reversal signal FC_REV. Frequency comparator reversal signal FC_REV is driven to a active state (e.g., logic high) when frequency F_FBK of feedback clock signal FBK_CLK becomes greater than frequency F_D_REF of divided reference clock signal D_REF_CLK and also when frequency F_D_REF of divided reference clock signal D_REF_CLK becomes greater than frequency F_FBK of feedback clock signal FBK_CLK. In one embodiment of the present invention, a coarse frequency search phase ends when the value of right shifter 530 is equal to one.

Table 2 provides an example of the operation for the embodiment of initialization circuit 250 in FIG. 5. In the example of Table 2, a delay value DV of 371.5 provides the optimum delay for matching frequency F_FBK of feedback clock signal FBK_CLK to frequency F_D_REF of divided reference clock signal D_REF_CLK.

TABLE 2

| Coarse Frequency Search Step | Right Shifter 530 | Delay Line Register 430 | A/!S |
| --- | --- | --- | --- |
| 0 | 128 | 256 | 1 |
| 1 | 64 | 384 | 0 |
| 2 | 32 | 320 | 1 |
| 3 | 16 | 352 | 1 |
| 4 | 8 | 368 | 1 |
| 5 | 4 | 376 | 0 |
| 6 | 2 | 372 | 0 |
| 7 | 1 | 370 | 1 |
| 8 | 1 | 371 | 1 |
| 9 | 1 | 372 | 0 |
| 10 | 1 | 371 | 1 |

As explained above initially delay line register 410 is configured to contain 256 and right shift register 530 is configured to contain 128. Because the ideal value for delay value DV is 371.5, control signal A/!S is in the Add state (i.e., logic high). At step 1, adder/subtractor 540 adds 128 to 256; delay line register 410 stores 384 (i.e., 256+128); and right shifter 530 right shifts 128, which becomes 64. When delay line register 410 contains 384 frequency comparator 550 drives control line A/!S to the subtract logic level (i.e., logic low). Then, in step 2, adder/subtractor 540 subtracts 64 from 384; delay line register 410 stores 320 (i.e., 384−64); and right shifter 530 right shifts 64 which becomes 32. When delay line register 410 contains 320 frequency comparator 550 drives control line A/!S to the add logic level (i.e., logic high). This process continues until the value in delay line register 410 is as close to the optimum value as possible.

Overflow register 550 receives output bit 9 of adder/subtractor 540. If output bit 9 is active, an overflow conditions has occurred and must be remedied by an outside control system (not shown). Typically, overflow conditions only occur if clock divider/multiplier 200 is used with clock frequencies that are too fast or too slow compared to the possible delay time provided by variable delay line 320.

As stated above, some embodiments of the present invention perform a fine frequency search using delay line fine tuning controller 420 after initialization circuit 250 establishes a delay value DV[8:0]. As explained above, variable digital delay lines may not be able to provide the exact delay necessary to generate output clock signal O_CLK at selected frequency F_SEL. The present invention solves this problem by using dual-input edge-triggered SR circuit 310 (FIG. 3) to synchronize rising clock edges on output clock signal O_CLK to reference clock REF_CLK during a concurrence of output clock signal O_CLK and reference clock signal REF_CLK. As explained above, a concurrence occurs when a rising edge of output clock signal O_CLK is suppose to be aligned with a rising edge reference clock signal REF_CLK, i.e., every Mth rising edge. However, between concurrence the frequency and phase of output clock signal O_CLK may differ from an ideal clock signal at selected frequency F_SEL. Delay line fine tuning controller 420 selectively adjusts the delay provided by variable delay line 320 to better match the frequency and phase of the ideal output clock signal.

Figure 6:
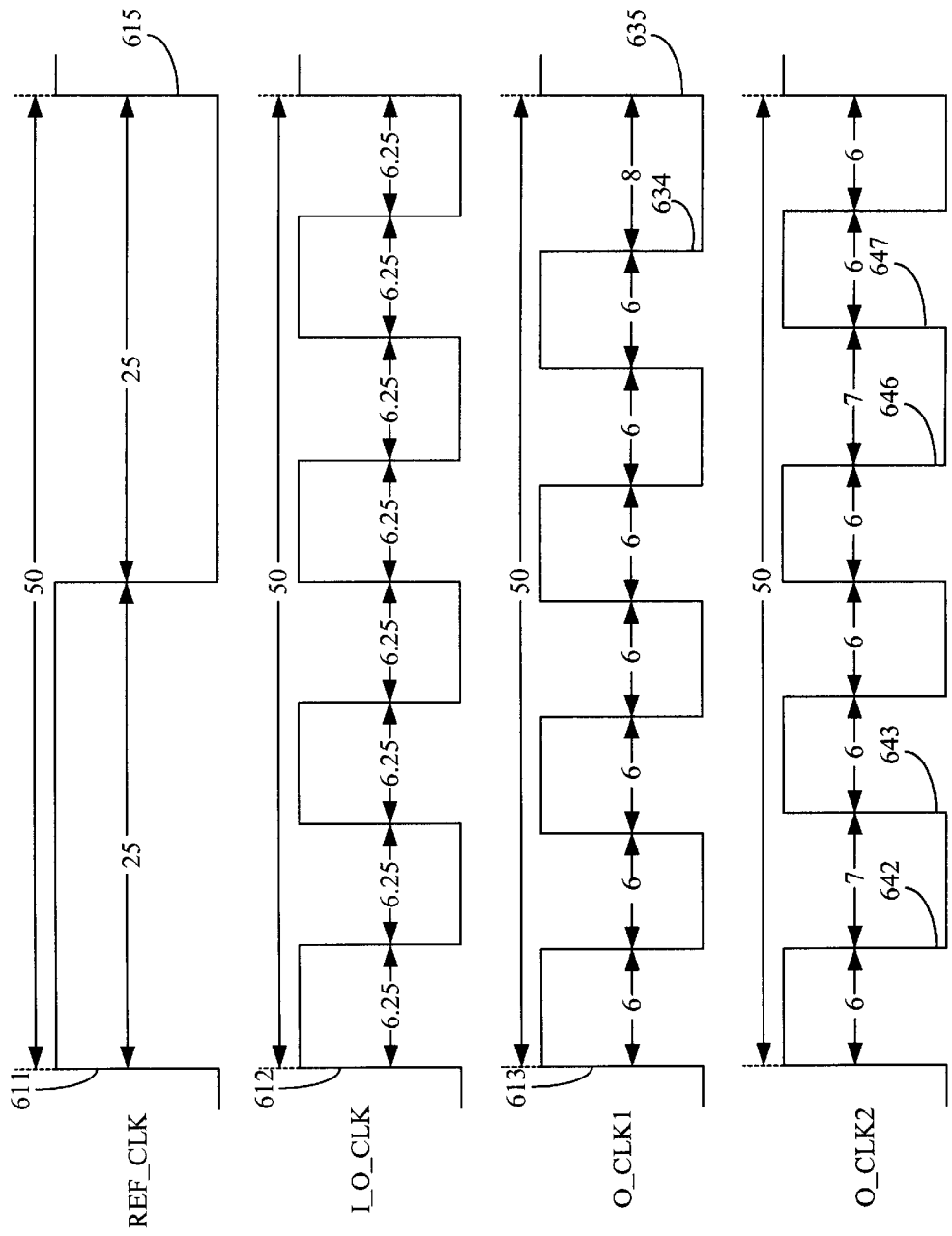
FIG. 6 is a timing diagram for the variable clocking circuit of FIG. 2(a) using a delay line fine tuning controller.

Effectively, delay line fine tuning controller 420 adds additional precision to variable delay line 320 by selectively increasing the delay provided by variable delay line 320 by one base delay BD at various times during a concurrence period. FIG. 6 illustrates the advantages provided by delay line fine tuning controller 420. Specifically, FIG. 6 shows a reference clock signal REF_CLK, an ideal output clock signal I_O_CLK, an output clock signal O_CLK1 using a dual-input edge-triggered SR circuit in accordance with one embodiment of the present invention, and an output clock signal O_CLK2 using both a dual-input edge-triggered SR circuit and delay line fine tuning controller 420 in accordance with another embodiment of the present invention.

In FIG. 6, multiplier M is equal to 4 and divider D is equal to 1. Reference clock signal REF_CLK has a period of 50 nanoseconds. Accordingly, 25 nanoseconds separates each consecutive clock edge in reference clock signal REF_CLK. Ideal output clock signal I_O_CLK has a period of 12.5 nanoseconds. Accordingly, 6.25 nanoseconds separates each consecutive clock edge in ideal output clock signal I_O_CLK. If the base delay unit of variable delay line 320 (FIG. 3) is one nanosecond, then variable delay line 320 is configured to provide 6 nanoseconds of delay between consecutive edges of output clock signal O_CLK1. However, during a concurrence, the rising edge of output clock signal O_CLK1 is controlled by the rising edge of reference clock signal REF_CLK. Accordingly, rising edge 635 of output clock signal O_CLK1 is aligned with rising edge 615 of reference clock signal REF_CLK. Therefore, the time between falling edge 634 of output clock signal O_CLK1 and rising edge 735 of output clock signal O_CLK1 is 8 nanoseconds. Thus, the average period during a concurrence cycle of output clock signal O_CLK1 is equal to 12.5 nanoseconds. However, output clock signal O_CLK1 is distorted from ideal output clock signal I_O_CLK because the required extra delay during a concurrence period is bunched at the end of the concurrence period.

Delay line fine tuning controller 420 selectively increments the delay provided by delay line 320 to more closely match ideal output clock signal I_O_CLK. Rather than lumping the extra delay required to match the average period of output clock signal O_CLK2 with ideal output clock signal I_O_CLK at the of the concurrence period, delay line fine tuning controller 420 spreads the additional required base delay units over the entire concurrence period. Thus, falling clock edge 642 and rising clock edge 643 of output clock signal O_CLK2 are separated by 7 nanoseconds rather than 6 nanoseconds. Similarly, falling clock edge 746 and rising clock edge 747 of output clock signal O_CLK2 are separated by 7 nanoseconds rather than 6 nanoseconds. Thus, the waveform of output clock signal O_CLK2 more closely matches ideal output clock signal I_O_CLK than output clock signal O_CLK1.

Figure 7:
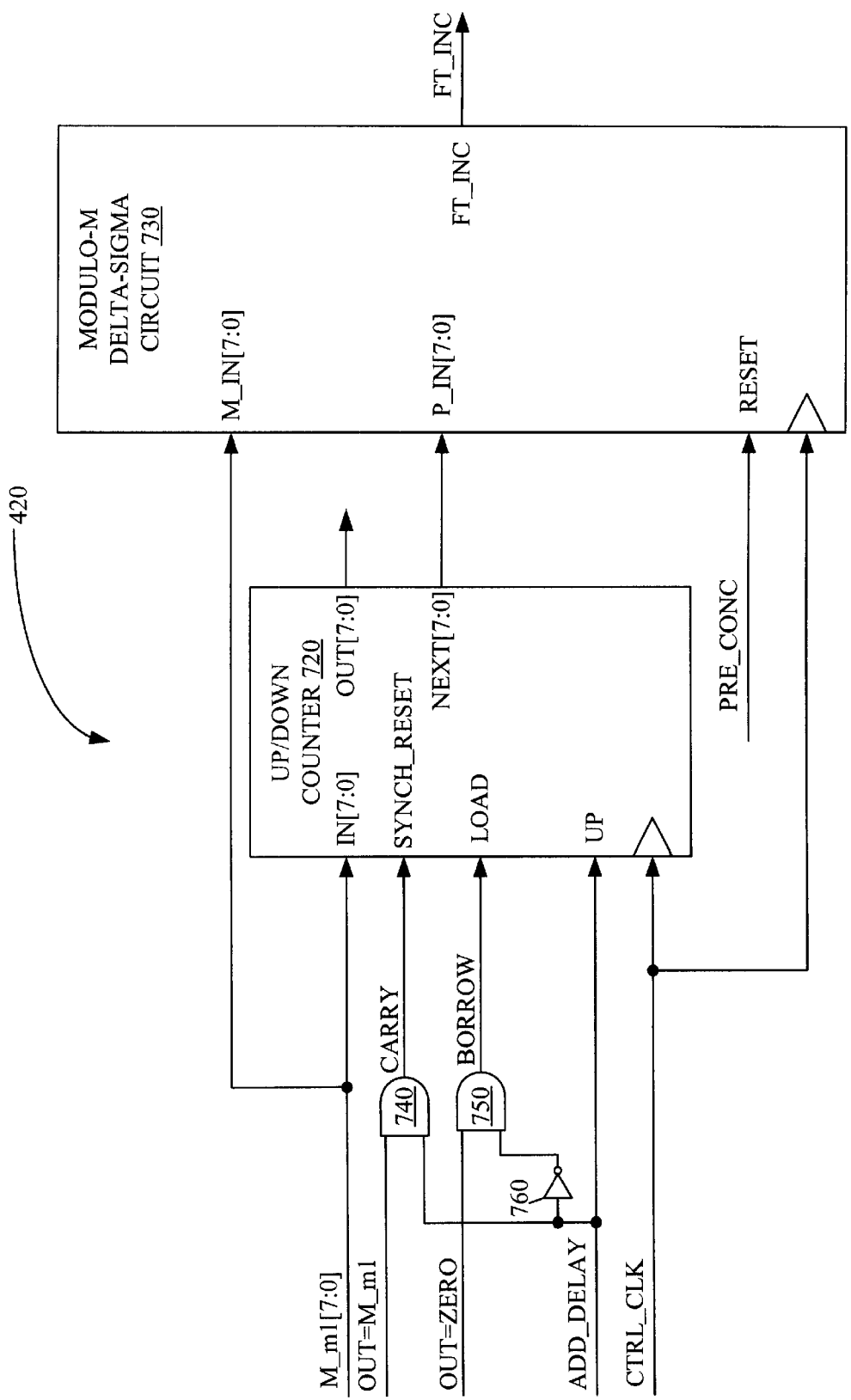
FIG. 7 is a block diagram of a delay line fine tuning controller in accordance with one embodiment of the present invention.

FIG. 7. is a block diagram of a delay line fine tuning controller 420 in accordance with one embodiment of the present invention. The embodiment of FIG. 7 includes an up/down counter 720, a modulo-M delta sigma circuit 730, AND gate 740, an AND gate 750, and an inverter 760. Up/down counter 720 is configured to count in modulo M. For example, if M is equal to 4, up/down counter 720 would count up in the sequence 0, 1, 2, 3, 0, 1, etc. and count down in the sequence 3, 2, 1, 0, 3, 2, etc.

Conceptually, up/down counter 720 is used to provide high precision bits for delay line register 410. Specifically, the value in up/down counter 720 indicates the number of additional base delay units needed during a concurrence period to more precisely match frequency F_OUT of output clock signal O_CLK to selected frequency F_SEL. In the example of FIG. 6, the base delay value is 1 nanosecond, the delay value in delay line register 410 is equal to 6 (i.e., one period of output clock signal O_CLK is 12 nanoseconds), the period of concurrence is 50 nanoseconds, and M is equal to 4. Thus, M periods of output clock signal O_CLK is equal to 48 nanoseconds (i.e., 4*12 nanoseconds). However, since the concurrence period is 50 nanoseconds, two more base delay units should be added to output clock signal O_CLK during each concurrence period. Therefore, up/down counter 720 should contain the value 2. Thus, in general up/down counter 720 should be equal to the concurrence period minus M times two times the base delay value. However, during actual operation the information to calculate the value for up/down counter 720 is not generally available. Therefore, searching is techniques are used to calculate the value for up/down counter 720. A searching technique in accordance with one embodiment of the present invention is described below.

Up/down counter 720 receives the value M−1 (i.e., multiplier M minus 1) on input terminals IN[7:0] via signals M_m1[7:0]. Up/down counter 720 provides both an output value OUT[7:0] and a next value NEXT[7:0]. Output value OUT[7:0] transitions on rising clock edges of control clock CTRL_CLK. In contrast, next value NEXT[7:0] is equal to the value that OUT[7:0] will become after the next rising clock edge. Add delay signal ADD_DELAY is also provided to control terminal UP. If add delay signal ADD_DELAY is driven to the active logic level (i.e., logic high) up/down counter 720 counts up. Otherwise, up down/counter 720 counts down.

To force modulo M counting, up/down counter 720 includes a synchronous reset terminal coupled to the output terminal of AND gate 740. AND gate 740, which receives status signal OUT=M_m1 and add delay control signal ADD_DELAY, generates carry signal CARRY. Status signal OUT=M_m1 is driven to logic high when output value OUT[7:0] is equal to multiplier M minus 1. Status signal OUT=M_m1 is typically generated by a comparator (not shown). Thus, if up/down counter 720 is counting up and output value OUT[7:0] is equal to multiplier M minus 1, then up/down counter 720 is reset to zero on the next rising edge of clock signal CTRL_CLK. Carry signal CARRY is also provided to delay line register 410. An active logic level (e.g., logic high) on carry signal CARRY enables delay line register 410 to increment.

Up/down counter 720 also includes a load control terminal LOAD coupled to the output terminal of AND gate 750. AND gate 750, which receives status signal OUT=ZERO and add delay control signal ADD_DELAY through inverter 760, generates borrow signal BORROW. Status signal OUT=ZERO is driven to logic high when output value OUT[7:0] is equal to zero. Status signal OUT=ZERO is typically generated by a comparator (not shown). Thus, if up/down counter 720 is counting down and output value OUT[7:0] is equal to zero, then up/down counter 720 is configured to load M minus 1. Borrow signal BORROW is also provided to delay line register 410. An active logic level (e.g., logic high) on Borrow signal BORROW enables delay line register 410 to decrement.

Next signal NEXT[7:0] is coupled to pulse input terminals P_IN[7:0] of modulo-M delta-sigma circuit 730.

Modulo-M delta sigma circuit 730 also receives value M−1 (i.e., multiplier M minus 1) on modulo input terminals M_IN[7:0] via signals M_m1[7:0], a pre-concurrence signal PRE_CONC, and control clock signal CTRL_CLK. Modulo-M delta-sigma circuit 730, drives fine tuning increment control signal FT_INC. For clarity, modulo-M delta sigma circuit 730 is said to receive a modulo value M (although in the embodiment of FIG. 7, M minus 1 is actually received) and a pulse count P. Pre-concurrence signal PRE_CONC, which is provided to reset terminal RESET of modulo-M delta sigma circuit 730, is driven to the active logic level (e.g., logic high) the clock cycle prior to a concurrence. During M periods fine tuning increment control signal FT_INC should contain P active pulses. The active pulses on fine tuning increment control signal FT_INC should be spread out across the M Periods. Table 3 provides some samples of fine tuning increment control signal FT_INC, where a "1" represents an active pulse and "0" represents in inactive pulse.

TABLE 3

| M | P | FT_INC |
|---|---|---|
| 4 | 2 | 1010 |
| 6 | 2 | 100100 |
| 6 | 3 | 101010 |
| 6 | 5 | 111110 |
| 7 | 3 | 1010100 |
| 7 | 4 | 1101010 |
| 9 | 4 | 101010100 |
| 12 | 5 | 101010010100 |
| 15 | 3 | 100001000010000 |
| | | ↑ |
| | | Concurrence |

Figure 8:
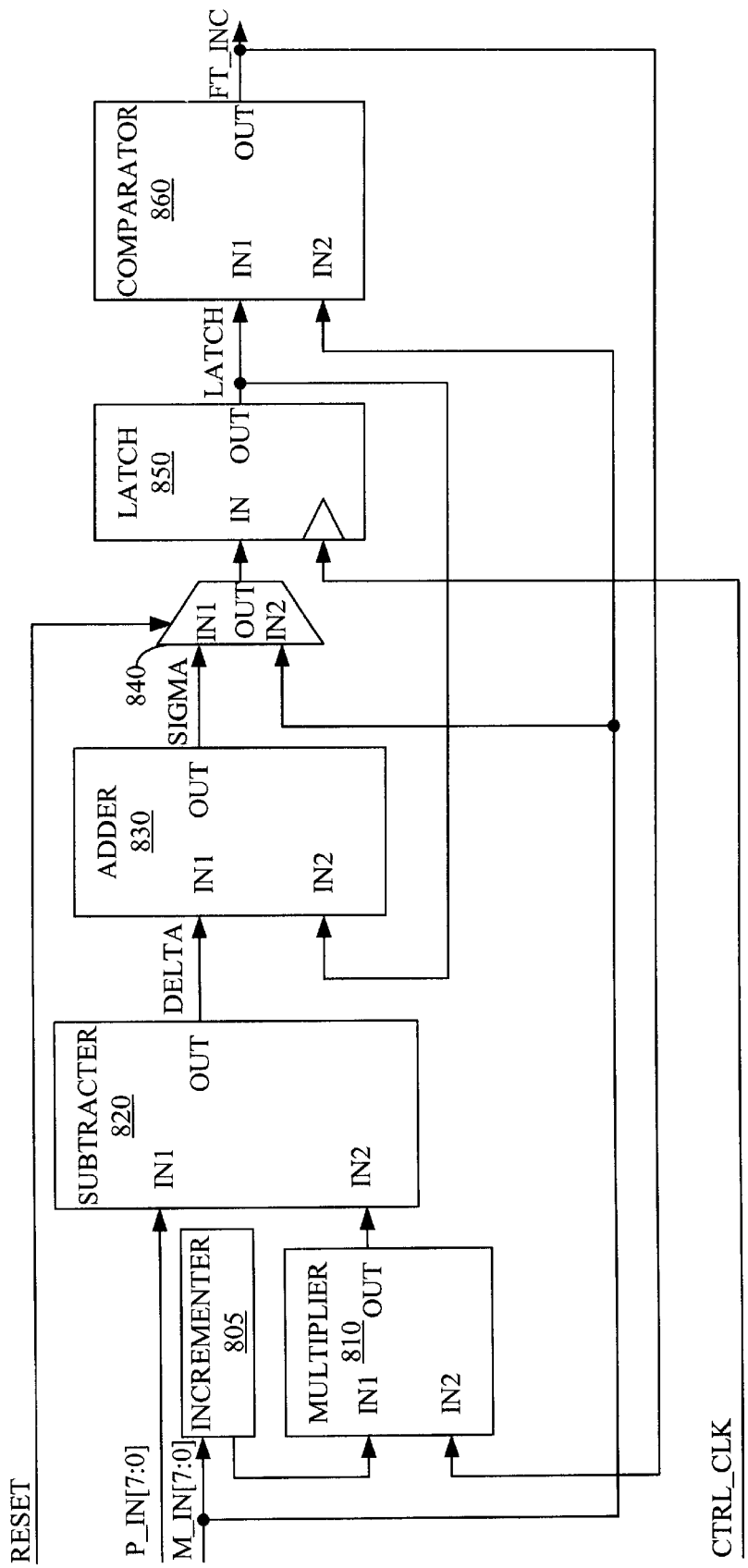
FIG. 8 is a block diagram of a modulo-M delta sigma circuit in accordance with one embodiment of the present invention.

FIG. 8 is a block diagram of modulo-M delta sigma circuit 730 in accordance with one embodiment of the present invention. The embodiment of FIG. 8 includes an incrementer 805, a multiplier 810, a subtracter 820, an adder 830, a multiplexing circuit 840, a latch 850, and a comparator 860. Modulo input terminals M_IN[7:0] are coupled to an input port IN of incrementer 805, a second input port IN2 of multiplexing circuit 840, and a second input port IN2 of comparator 860. Because the specific embodiment of FIG. 8 is designed to receive modulo value M minus 1 rather than modulo value M on modulo input terminals M_IN[7:0], incrementer 805 increments the value provided on modulo input terminals M_IN[7:0] by one to generate modulo value M, which is provided to a first input port of multiplier 810. Other embodiments of the present invention may receive modulo value M on modulo input terminals M_IN[7:0].

These embodiments would not require incrementer 805. A second input port IN2 of multiplier 810 is coupled to an output terminal of comparator 860. Multiplier 810 multiples the value provided on modulo input terminals M_IN[7:0] by the output value of comparator 860 to generate an output product, which is provided to a second input port IN2 of subtracter 820. In many embodiments of the present invention, multiplier 810 is implemented using a plurality of AND gates, because the output value of comparator 860 is a single bit.

Pulse input terminals P_IN[7:0] are coupled to a first input terminal of subtracter 820. Subtracter 820 is configured to subtract the output value from multiplier 810 from the pulse value provided on pulse input terminals P_IN[7:0] to generate a delta value DELTA on output port OUT of subtracter 820. Output port OUT of subtracter 820 is coupled to a first input port IN1 of adder 830. A second input port IN2 of adder 830 is coupled to an output port OUT of latch 850. Adder 830 is configured to add delta value DELTA provided by subtracter 820 to a latch value LATCH provided by latch 850 to generate a sigma value SIGMA on output port OUT of adder 830. Output port OUT of adder 830 is coupled to a first input port IN1 of multiplexing circuit 840. Some embodiments of the present invention calculate sigma value SIGMA using a sigma calculation circuit, such as a three input adder, which can perform the calculation faster than using a separate delta calculation circuit, such as subtracter 820. In these embodiments the sigma calculation circuit replaces subtracter 820 and adder 830. For embodiments using a three input adder, the output value of multiplier 810 can be converted into a 2's complement format prior to the three input adder. Furthermore, incrementer 805 and multiplier 810 may be combined within a circuit to compute the 2's complement format.

Multiplexing circuit 840 is configured to drive either sigma value SIGMA or the value provided on modulo input terminals M_IN[7:0] to input port IN of latch 850 through output port OUT of multiplexing circuit 840. Reset terminal RESET is coupled to a control terminal of multiplexing circuit 840. Pre-concurrence signal PRE_CONC, which is coupled to reset terminal RESET in FIG. 7, determines the output value of multiplexing circuit 840. Specifically, during the clock cycle before concurrences multiplexing circuit 840 is configured to drive the value provided on modulo input terminals M_IN[7:0] to input port IN of latch 850. Otherwise, multiplexing circuit 840 is configured to drive sigma value SIGMA to input port IN of latch 850. Latch 850, which is clocked by control clock signal CTRL_CLK, provides a LATCH value on output port OUT of latch 850 to a first input port IN1 of comparator 860. Comparator 860, which is configured to compare latch value LATCH with the value provided on modulo input terminals M_IN[7:0], generates fine tuning increment signal FT_INC on output terminal OUT of comparator 860. Specifically, if latch value LATCH is greater than the modulo value provided on modulo input terminals M_IN[7:0], fine tuning increment signal FT_INC is driven to the active logic level (e.g., logic high). Otherwise, fine tuning increment signal FT_INC is driven to the inactive logic level (e.g., logic low).

Table 4 provides a pseudo code implementation of a second embodiment of modulo-M delta sigma circuit 730. One skilled in the art of digital design can convert the pseudo code of Table 4 to a hardware definition language such as Verilog to implement the circuit.

TABLE 4

DELTA=P−(FT_INC*M)
SIGMA=DELTA+LATCH
IF RESET then LATCH=(M−1)
  else LATCH=SIGMA
IF LATCH>(M−1) then FT_INC=1
  else FT_INC=0

As explained above, one embodiment of the present invention operates variable clocking circuit 200 in three distinct phases. Specifically, variable clocking circuit 200 is operated in a coarse frequency search phase, a fine frequency search phase, and a clock maintenance phase. During the coarse frequency search phase, variable delay line 320 (FIG. 3) is configured using the fast binary search as described above. Delay line fine tuning controller 420 (FIG. 4) is disabled during the coarse frequency search phase. The coarse frequency search phase ends when right shifter 530 (FIG. 5) contains a value of one.

During the fine frequency search phase, delay line fine tuning controller 420 is activated and clock selector 230 (FIG. 2) is configured to select output clock signal O_CLK as the control clock signal CTRL_CLK. During the fine frequency search phase, delay line fine tuning controller 420 is controlled by frequency comparator 550 (FIG. 5) using control signal A/!S as described above. Specifically, control signal A/!S determines whether up/down counter 720 increments or decrements. Halt/restart circuit 245 is also used in the fine frequency search phase during each concurrence period. In the fine frequency search phase, up/down counter 720 increments or decrements by one each concurrence period. As explained above, up/down counter 720 is linked to delay line register 410 by carry signal CARRY and borrow signal BORROW. Thus, the value in delay line register 410 may change during the fine frequency search phase. The fine frequency search phase ends when frequency comparator 550 detects a reversal and drives frequency comparator reversal signal to the active state.

During the clock maintenance phase, phase comparator 240 (FIG. 2) takes control of oscillator control circuit 260 from initialization circuit 250. During the maintenance phase, delay line fine tuning controller 420 is selectively enabled. Specifically, in one embodiment of the present invention, the maintenance phase cycles through three sub-phases. Each sub-phase lasts for one concurrence period. In the first sub-phase, phase comparator 240 is initialized. During the first sub-phase the value of up/down counter 720 does not change. In the second sub-phase phase comparator 240 determines whether feedback clock signal FBK_CLK leads or lags divided reference clock signal D_REF_CLK. In the third sub-phase delay line fine tuning controller 420 is enabled. Thus, up/down counter 720 can increment or decrement by one as controlled by phase comparator control signal PC_CTRL. As explained above phase comparator control signal PC_CTRL indicates whether feedback clock signal FBK_CLK leads or lags divided reference clock signal D_REF_CLK. If delayed reference clock signal D_REF_CLK leads feedback clock signal FBK_CLK, then phase comparator 240 causes up/down counter 720 to decrement during the second sub-phase. Otherwise, phase comparator 240 causes up/down counter 720 to increment during the second sub-phase. In other embodiments, the maintenance phase may include more or fewer sub-phases. For example, in one embodiment, the first sub-phase and the second sub-phase described above are combined into a single sub-phase. Some embodiments of the present invention wait until phase comparator 240 detects multiple reversals (such as four reversals) before declaring output clock signal O_CLK is at selected frequency F_SEL.

In the various embodiments of this invention, novel structures have been described for variable clocking circuits.

By resynchronizing the output clock signal with the reference clock signal during each concurrence, the present invention enables the implementation of a purely digital clock multiplier/divider without the cumulative misalignment problem of conventional clock circuits. Furthermore, by using a delay line fine tuning controller, the present invention can shape the output clock signal to more precisely match an ideal output clock signal. The various embodiments of the structures and methods of this invention that are described above are illustrative only of the principles of this invention and are not intended to limit the scope of the invention to the particular embodiments described. For example, in view of this disclosure, those skilled in the art can define other latches, registers, clock dividers, phase comparators, frequency comparators, up/down counters, initialization circuits, delta-sigma circuits, latches, halt/restart circuits, delay lines, variable digital oscillators, edge-triggered SR circuits, active edges, enable logic levels, and so forth, and use these alternative features to create a method, circuit, or system according to the principles of this invention. Thus, the invention is limited only by the following claims.

What is claimed is:

1. A variable clocking circuit for generating an output clock signal having a plurality of active edges from a reference clock signal having a plurality of active edges, the variable clocking circuit comprising:
    a variable oscillator configured to generate the output clock signal in response to a tuning signal;
    a first clock divider circuit coupled to the variable oscillator and configured to divide the output clock signal by a multiplier M to generate a feedback clock signal; and
    a phase comparator coupled to the first clock divider circuit and configured to receive the reference clock signal and to generate the tuning signal and the feedback clock signal;
    wherein a subset of the plurality of active edges of the output clock signal are clocked by active edges of the reference clock signal.

2. The variable clocking circuit of claim 1, wherein the subset of the plurality of active edges of the output clock signal comprises every Mth active edge.

3. The variable clocking circuit of claim 1, further comprising a second clock divider circuit configured to generate the reference clock signal from a primary reference clock signal by dividing the primary reference clock signal by a divider D.

4. The variable clocking circuit of claim 1, wherein the variable oscillator comprises:
    a variable delay line having an input terminal and an output terminal; and
    an edge-triggered latch having an output terminal coupled to the input terminal of the variable delay line.

5. The variable clocking circuit of claim 4, wherein the edge-triggered latch is configured to be selectively clocked by the reference clock signal.

6. The variable clocking circuit of claim 5, wherein the edge-triggered latch is configured to be selectively clocked by an output signal of the variable digital delay line.

7. The variable clocking circuit of claim 4, wherein the edge triggered latch is an edge-triggered SR latch.

8. The variable clocking circuit of claim 4, wherein the variable delay line comprises:
    a low precision delay line having an output terminal and an input terminal coupled to the output terminal of the edge-triggered latch; and
    a trim circuit having an input terminal coupled to the output terminal of the low precision delay line.

9. The variable clocking circuit of claim 4, further comprising a delay line register coupled to the variable delay line.

10. The variable clocking circuit of claim 9, further comprising:
    an adder/subtracter having a plurality of output terminals coupled to the delay line register and a control terminal coupled to the frequency comparator; and
    a right shifter coupled to the adder/subtracter.

11. The variable clocking circuit of claim 9, further comprising an incrementer coupled between the delay line register and the variable delay line.

12. The variable clocking circuit of claim 11, wherein the incrementer selectively increases a delay provided by the variable delay line.

13. The variable clocking circuit of claim 11, further comprising a delay line fine tuning controller coupled to the incrementer.

14. A variable clocking circuit for generating an output clock signal from a reference clock signal, the circuit comprising a variable oscillator:
    a first clock divider circuit coupled to the variable oscillator and configured to divide the output clock signal by a multiplier M to generate a feedback clock signal; and
    a phase comparator coupled to the first clock divider circuit and configured to receive the reference clock signal and the feedback clock signal;
    wherein the variable oscillator comprises:
        an edge-triggered latch configured to receive the reference clock signal and to generate the output clock signal; and
        a variable delay line coupled to an input and an output of the edge-triggered latch.

15. The variable clocking circuit of claim 14, further comprising a second clock divider circuit configured to generate the reference clock signal from a primary reference clock signal by dividing the primary reference clock signal by a divider D.

16. The variable clocking circuit of claim 14, wherein the edge-triggered latch is configured to be selectively clocked by the reference clock signal.

17. The variable clocking circuit of claim 16, wherein the edge-triggered latch is configured to be selectively clocked by an output signal of the variable delay line.

18. A method for generating an output clock signal from a reference clock signal, wherein the output clock signal has a output clock frequency approximately equal to a multiplier M times a reference clock frequency of the reference clock signal, the method comprising:
    creating a feedback clock signal from the output clock signal by dividing the output clock signal by M;
    comparing a feedback frequency of the feedback clock signal with the reference clock frequency;
    increasing an output period of the output clock signal when the feedback frequency is greater than the reference frequency;
    decreasing the output period of the output clock signal when the feedback frequency is less than the reference frequency;
    synchronizing a subset of active edges of the output clock signal with the reference clock signal and driving the output clock signal with an edge-triggered latch.

19. The method of claim 18, wherein the subset of active edges comprises every Mth active edge of the output clock signal.

20. The method of claim 18, further comprising generating the reference clock signal from a primary reference clock signal by dividing the primary reference clock signal by a divider D.

21. The method of claim 18, wherein the increasing an output period of the output clock signal when the feedback frequency is greater than the reference frequency, comprises increasing a delay value of a delay line.

22. The method of claim 18, wherein the decreasing the output period of the output clock signal when the feedback frequency is less than the reference frequency, comprises decreasing a delay value of a delay line.

23. The method of claim 18, wherein the synchronizing a subset of active edges of the output clock signal with the reference clock signal comprises clocking the edge-triggered latch with the reference clock signal for each active edge of the subset of active edges.

* * * * *